United States Patent [19]

Lent et al.

[11] Patent Number: 4,595,879
[45] Date of Patent: Jun. 17, 1986

[54] NUCLEAR MAGNETIC RESONANCE FLOW IMAGING

[75] Inventors: Arnold H. Lent, Macedonia; Waldo S. Hinshaw, Cleveland Heights; Russell A. Compton, Chesterland, all of Ohio

[73] Assignee: Technicare Corporation, Solon, Ohio

[21] Appl. No.: 551,244

[22] Filed: Nov. 14, 1983

[51] Int. Cl.⁴ .............................................. G01R 33/24
[52] U.S. Cl. ..................................... 324/309; 324/306
[58] Field of Search ................ 358/105; 340/728, 725, 340/793, 792; 324/306, 307, 309; 128/653

[56] References Cited

U.S. PATENT DOCUMENTS

| 3,932,805 | 1/1976 | Abe | 324/309 |
| 4,063,281 | 12/1977 | Kornreich | 358/105 |
| 4,318,043 | 3/1982 | Crooks | 324/309 |
| 4,471,306 | 9/1984 | Edelstein | 324/309 |
| 4,516,075 | 3/1985 | Moran | 324/306 |

OTHER PUBLICATIONS

NMR Imaging Proceedings of an International Symposium of NMR Imaging: "NMR Scanning: Spinwarp Method" Hutchinson–pp. 77–80 (10/81).

"NMR Diffusion and Flow Measurements and an Introduction to Spin Phase Graphing" J. R. Singer, Institute of Physics–(1978) pp. 281–291.

Primary Examiner—Reinhard J. Eisenzopf
Assistant Examiner—G. Peterkin
Attorney, Agent, or Firm—W. Brinton Yorks, Jr.

[57] ABSTRACT

The effects of particle motion or flow within a sample may be measured by applying a motion-encoding gradient to the sample, along with spatial encoding gradients. The motion-encoding gradient applies two gradient fields of respective opposite sense to the spins of the sample so as to encode motion as a net phase component resulting from the two fields. Two image data sequences, one with motion encoding and one without, may be compared to measure the effects of motion, or a plurality of image data sequences may be taken, each with a different value motion-encoding gradient. A Fourier transformation performed on the sequence data in the latter case with respect to the variation in the motion-encoding gradient pulses will yield a plurality of images, each representing the amount of material which exhibits a different velocity.

16 Claims, 4 Drawing Figures

NUCLEAR MAGNETIC RESONANCE FLOW IMAGING

This invention relates to nuclear magnetic resonance (NMR) imaging systems and, in particular, to techniques for encoding the motion of an NMR sample so that the movement, or flow, may be represented in an NMR image format.

The NMR phenomenon may be employed to form images representing various characteristics of numerous materials. The sample which is to be imaged is placed in a magnetic field, whereby a statistically significant fraction of atomic nuclei align themselves with the magnetic field. The strength of this field is disturbed in a controlled manner by magnetic field gradients, which provide spatial encoding, and by r.f. magnetic fields which disturb the nuclei from their equilibrium alignment. When the r.f. excitation signals are terminated, the nuclei generate detectable NMR signals. The detected NMR signals, which bear spatial encoding characteristics, are then processed to produce an image, typically of a plane or planes of the sample being imaged.

In the application of NMR for the clinical imaging of patients, four principal parameters or properties are generally employed to form an image. The brightness or color at any given point or pixel in an image can represent any one or more of the following characteristics; (1) the number of nuclei, or proton density, at that point; (2) the longitudinal NMR-relaxation time, termed $T_1$; (3) the transverse NMR relaxation time, termed $T_2$; or (4) the motion of nuclei at that point. The source of nuclear motion could be voluntary acts such as the physical translation of an object such as a patient moving an arm or leg. It could also be involuntary acts, such as movement of the chest during breathing or the flow of blood or other fluids. There exist well established methods and procedures for measuring and forming images which separately represent each of the first three properties. These methods produce images which represent the properties separately or, in the case of relaxation times, can represent relaxation as a function of time at each image pixel. Techniques for representing motion, however, have been relatively undeveloped to date.

Techniques for separating out the contributions of motion to an image, and for quantifying motion, are important for clinical NMR imaging. For example, it may be important for a diagnostician to know whether a dark spot in the image represents flowing blood or a lesion. Flowing blood generally is represented as a dark image portion providing little visual information, due generally to motion which has moved a particle outside the passband of spatially encoded signals between the times of excitation and NMR signal formation. The generally long relaxation times of liquids also contributes to the lack of signal. Furthermore, it is often desirable to be able to quantify blood flow and blood perfusion. Knowledge of impaired blood flow, particularly in the heart and brain, is at times critically important.

In accordance with the principles of the present invention, techniques are provided for investigating the motion of a sample in an NMR image through application of a motion-encoding gradient field. During one of a plurality of experiments, when signals are acquired for a single data "line," spatial encoding field gradients are applied to the sample. A direction is chosen for the motion-encoding gradient, and a two-pulse gradient is applied during the experiment in the chosen direction, in addition to the usual spatial-encoding gradient fields. The received NMR signals will bear motion-representative information indicative of the change in location of the sample in the chosen direction between the times of the motion-encoding gradient pulses.

In a preferred embodiment of the present invention, the motion-encoding gradient is a phase-encoding gradient. In conjunction with any number of methods of NMR image formation, such as the pulsed-gradient, fourier methods, a plurality of sequences of data lines is taken, with the amplitudes of the motion-encoding gradient pulses varied from sequence to sequence. A Fourier transform is then performed with respect to the variation of the gradient amplitude. This is in addition to the usual two-dimensional Fourier transform over the position-encoding gradient and the time variable. Overall, the reconstruction procedure may be formally identical to that for three-dimensional spatial imaging. The result is a set of images with the intensity in each image representing the amount of material with a given velocity. By choosing a particular image pixel and plotting the image intensity as a function of the image number, a velocity histogram may be formed. The velocity function may be displayed alone, or as a modulation of color in an otherwise typical black-and-white NMR image in which the amount of material is represented by pixel intensity.

IN THE DRAWINGS

In NMR imaging, two basic techniques are used to encode the spatial position of a sample which produces a detectable NMR signal. In either case, the encoding is done so that computer post-processing of the collected data will "decode" the spatial position of a sample. The first technique is to apply a linear magnetic field gradient, or variation in the strength of the magnetic field, while the NMR signal is being observed. Since the frequency of the NMR signal is proportional to the strength of the magnetic field in which the sample which emits the NMR signal is located such a gradient causes the observed frequency of the NMR signal to depend upon the position of sample along the direction of the gradient. Through Fourier transform processing with respect to frequency as a variable, the computer can sort out the strength of the NMR signal as a function of its frequency, and hence the spatial distribution of the sample with reference to the gradient field.

The second technique for encoding the spatial position of a sample into its NMR signal is to encode the phase of the NMR signal, rather than employing frequency encoding as described above. By applying a pulsed gradient after the initial 90° degree pulse, but before the NMR signal is observed, the starting phase of the NMR signal depends upon where the sample is located along the direction of the gradient. The NMR signal is recorded repeatedly, with a different strength or duration of gradient each time. The computer then performs a Fourier transformation of the collected signal data with respect to the strength or duration of the gradient rather than with respect to frequency as in the frequency-encoding case. The result is a representation of NMR signal strength as a function of phase, and hence the spatial distribution of the sample with reference to the phase-encoding gradient field.

Either frequency encoding or phase-encoding may be used in accordance with the principles of the present invention to encode the effects of motion in an NMR image. Frequency encoding, however, generally provides higher resolution than phase encoding for a limited data collection time. Since it is believed that clinicians are generally interested in good spatial resolution, it is preferred to encode the effects of motion through phase encoding. Furthermore, only one use of frequency encoding can be made in any single NMR experiment, but numerous phase encoding gradients may be employed. It is therefore preferable to use both frequency- and phase-encoding gradients for spatial resolution, and phase-encoding gradients for motion encoding.

Figure 1:
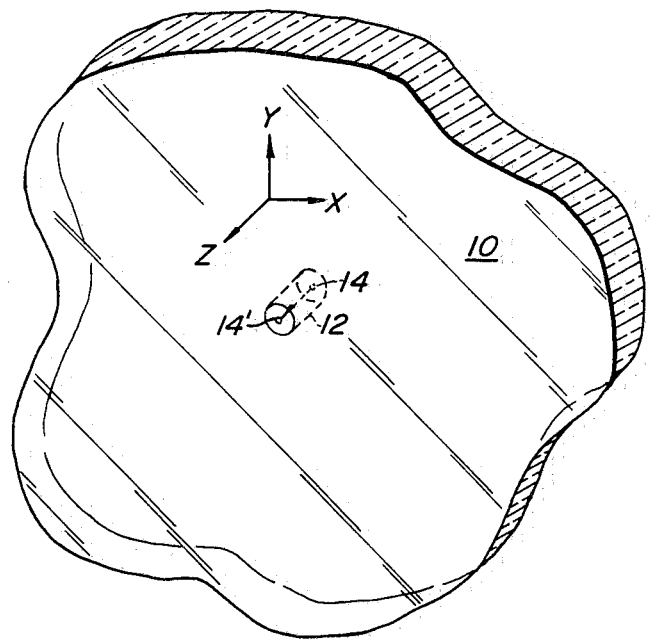
FIG. 1 illustrates a moving particle in an NMR image slice.

Motion encoding in accordance with the present invention is premised upon basic Newtonian mechanics. Referring to FIG. 1, an NMR image "slice" 10 is shown, which contains a blood vessel 12. The image is resolved in x, y, and z directions with the blood vessel 12 oriented in the z direction. A particle of blood passes through the vessel in the z direction and, at a first point in time, is located as shown at 14. At a later point in time, the particle is located at a different coordinate as shown at 14'. If the positions of the particle 14 and 14' are known, and the time taken for the particle to move from position 14 to position 14' is also known, a computation of the change in position with the passage of time will yield the velocity of the particle. The present invention utilizes this basic principle in its encoding techniques.

Figure 2:
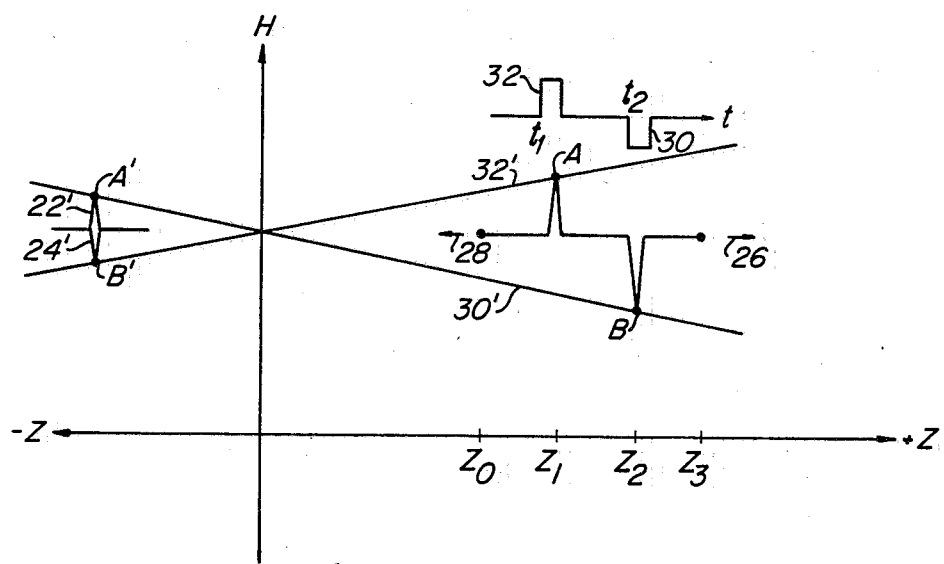
FIG. 2 illustrates the principle of phase encoding employed in accordance with the principles of the present invention.

FIG. 2 illustrates application of this principle through the use of NMR techniques. The abscissa in FIG. 2 represents the z direction, and the ordinate represents the strength of the static magnetic field H. A particle moves in the magnetic field H from point $Z_0$ to point $Z_3$. As it travels in the direction of arrow 26, the particle experiences a motion-encoding gradient field during the peak of the first gradient pulse 32, which is applied at time $t_1$. Point A on line 32' represents the phase-encoding resulting from the first gradient pulse when the particle is at position $Z_1$. The particle continues to travel in the direction of arrow 26, and at time $t_2$ the second pulse 30 is applied. Line 30' represents the motion-encoding gradient field during the peak of gradient pulse 30. The particle, now at position $Z_2$, is phase-encoded in an opposite sense as compared with the field developed by gradient pulse 32, which phase-encoding is represented by point B on line 30'.

The particle is now encoded for motion, and the NMR signal subsequently produced by the particle will contain a phase component which is the difference, or net, of the two phase-encoding experiences of the particle.

Since B is greater than A, the net phase encoding of the particle indicates that it is moving in the direction of arrow 26. The greater the observed difference, or the net phase encoding, the greater the velocity of the particle.

Similarly, if the particle is travelling from position $Z_3$ to position $Z_0$, the positions of the pulses 32 and 30 will be reversed since the particle is now moving in the opposite direction, arrow 28, with time. The sign of the difference of A and B will change; that is, the net phase difference will be of opposite polarity as that of the previous example. The polarity change indicates movement in the $-Z$ direction, as indicated by arrow 28.

If the particle is standing still, the two phase encodings will offset each other. This condition is represented in FIG. 2 by transitions 22' and 24', which are of equal and opposite amplitudes, A' and B'. The net phase difference encoded by the two gradient pulses is zero, indicating that such a particle is stationary.

Figure 3:
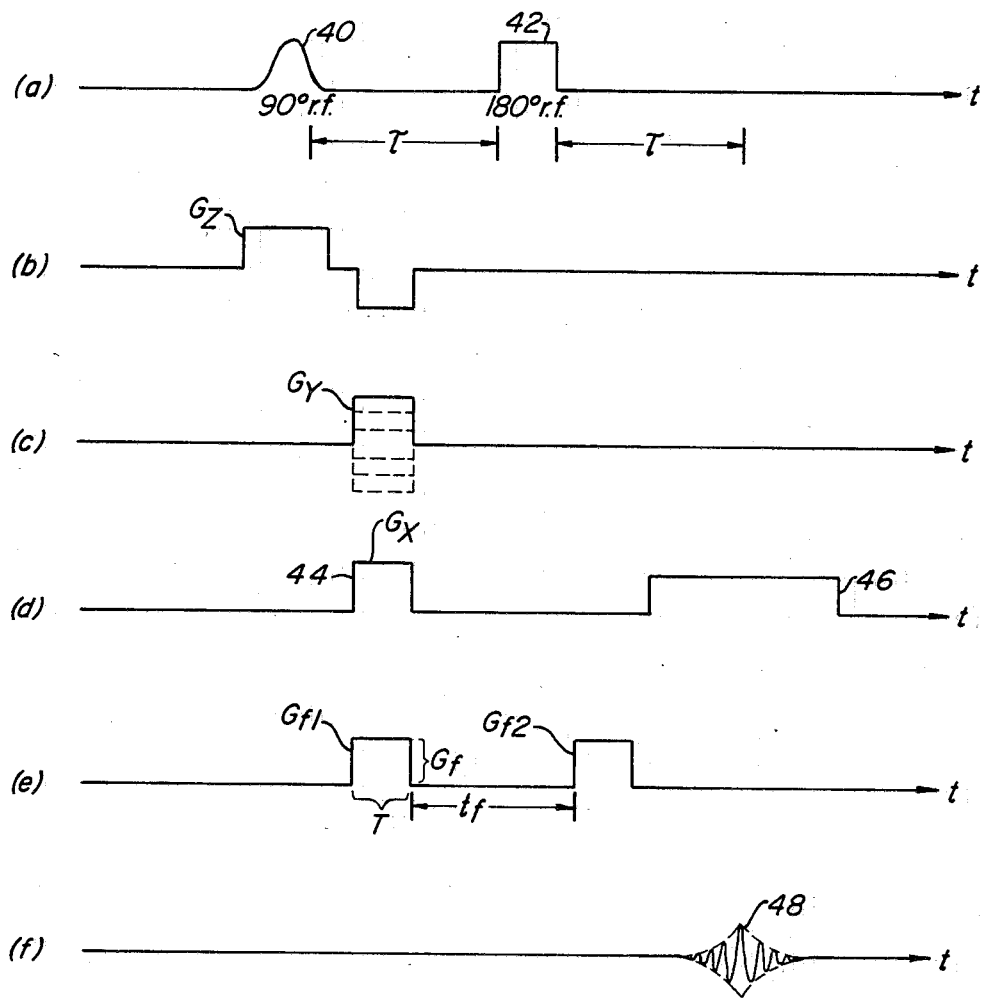
FIG. 3 illustrates the waveform of an NMR experiment performed in accordance with the principles of the present invention.

FIG. 3 shows NMR pulse waveforms used to encode spatial information and motion in accordance with the principles of the present invention. FIG. 3a shows radio frequency pulses used to generate an NMR spin-echo signal. The first pulse 40 is a "soft" 90 degree pulse which tips the spins into the transverse plane and, together with the Z gradient $G_z$, selects the plane or slice to be imaged by effectively irradiating only those spins within a given plane. The second pulse 42 is a 180 degree pulse which refocuses the phases of the spins and causes an echo to develop. The two pulses 40 and 42 are separated by a time interval $\tau$, and the spin-echo signal 48 peaks following a time period $\tau$ after the refocusing pulse 42. The spinecho signal 48 is shown in FIG. 3f, and is observed and recorded by the imaging system.

FIG. 3b shows a composite Z gradient $G_z$. The first $G_z$ pulse during the time of the 90 degree pulse 40 selects the slice to be viewed, which generally is normal to the Z direction. The second $G_z$ pulse rephases the spins in the slice, which, after the slice selection process, are left with a distribution of phases.

FIG. 3c shows a phase-encoding Y gradient $G_y$. Application of this gradient causes the spins to have a phase which depends upon their location along the Y gradient direction. As the pulse sequences of FIG. 3 are repetitively applied to the slice to acquire data from the slice, the amplitude of the $G_y$ gradient is changed from one line to another. A Fourier transform is then performed on the acquired NMR signal data as a function of the $G_y$ gradient amplitude to reveal the spatial distribution of material in the slice as a function of the Y direction.

FIG. 3d illustrates a frequency-encoding $G_x$ gradient pulse waveform for encoding spins in the x direction. The first pulse 44 of the waveform is a "pre-phasing" pulse, which determines the point in time at which the spin echo signal will exhibit a known reference phase. The point in time is generally determined to be the center of the second "read" pulse 46 of the waveform. The "read" pulse is applied during the time of acquisition of the spin-echo signal data.

FIG. 3e shows phase-encoding gradient pulses for encoding motion. These pulses, $G_{f1}$ and $G_{f2}$, are applied during the time interval between the 90 degree pulse 40 and the spin-echo signal 48. The time interval between the two pulses, $t_f$, is desirably as large as possible for better resolution of motion. The function of $G_{f1}$ pulse is to phase encode the spins in the slice in a first sense. The second pulse $G_{f2}$ then phase-encodes the spins in the opposite sense. If a particular spin system has moved in the direction of the motion-encoding gradient between the times of the applied pulses, the spin-echo signal will exhibit a net encoded phase component representative of the magnitude and direction of travel in the gradient direction. If the spin system does not move, the opposite senses of phase-encoding will cancel, and the spin system will exhibit no net motion-encoded phase.

The NMR waveforms of FIG. 3 are applied to a sample once to acquire what will be referred to as a "line" of data. A member of such lines, taken while varying the $G_y$ gradient amplitude from line to line, constitutes a "sequence", from which an image can be reconstructed. Two techniques will be discussed for measuring flow, or velocity: one technique involving the acquisition of two sequences, one sequence with a motion-encoding gradient and one without motion-encoding, and a second technique involving the acquisition of a plurality of motion-encoded sequences. Two aspects of both techniques, the nature of the motion-encoding gradient pulses and the manner in which the acquired data is processed, will also be discussed.

In the first technique, a first sequence of data lines is acquired without the influence of a motion-encoding gradient. This may be done by using a motion-encoding gradient pulse shape whose zeroth moment and first moment are both zero, or more simply by not applying any motion-encoding gradients. The first sequence is preferably made insensitive to motional effects by making the first moment of gradient pulse sequences in the direction or directions in which motion is to be measured equal to zero, as described in concurrently filed U.S. application Ser. No. 551,245, filed 11-14-83, entitled "NUCLEAR MAGNETIC RESONANCE IMAGING WITH REDUCED SENSITIVITY TO MOTIONAL EFFECTS". If the Z-direction is chosen for motion measurement, for example, the $G_Z$ gradient is given a zero first moment, which is done by using pulses with areas (positive or negative) times a "moment arm" time interval from the center of the 90 degree pulse to the center of each pulse area, which sums to zero.

A second sequence is acquired, preferably simultaneously with the first by taking lines of the two sequences alternately. By interleaving the line acquisition, errors in the received NMR signals will be substantially the same in the two sequences. The second sequence uses the same gradients as the first, with the addition of the effective motion-encoding gradient, pulses $G_{f1}$ and $G_{f2}$. The motion-encoding gradient pulses exhibit a zero value zero moment (i.e., the positive and negative areas of the pulses are equal), so that stationary material will experience no phase encoding from the gradient. (Note that the 180 degree pulse changes the signs of the effective gradient pulses occurring thereafter.) The motion-encoding gradient pulses also exhibit a non-zero value first moment so that moving material will be phase-encoded. In the example it will be assumed that motion is only to be encoded in the Z-direction, and hence only one two-pulse motion-encoding gradient is applied to the sample.

The two sequences are processed to form two, two-dimensional complex images, as by Fourier transformation processing. The magnetization induced during the first sequence is expressed as:

$$M(t) = M(O)\exp(i\gamma Ht)$$

and the magnetization of the second sequence is expressed as:

$$M(t, z_1 - z_2) = M(O)\exp\{i\gamma[Ht + G_fT(z_1 - z_2)]\}$$

where $z_1$ and $z_2$ are the positions in the Z-direction of a moving particle at the beginning and end of the motion-encoding gradient pulses, $G_f$ is gradient amplitude, and T is pulse duration. This magnetization may be interpreted as arising from an initial magnetization $$M(O)\exp[i\gamma G_fT(z_1 - z_2)].$$

The images corresponding to these two sequences are now generated, and a ratio is taken of the two images on a pixel-by-pixel basis. The expression $(z_1 - z_2)$, a distance expression, is equal to velocity times time or $$z_1 - z_2 = Vt_f$$

The pixel ratio then results in a cancellation of terms representing material concentration, and can be expressed as $$\text{Ratio} = \exp(i\gamma G_fTVt_f)$$

where the pixel values in the ratio image depend upon velocity. Taking the ratio of pixels in this manner cancels phase errors, which is the subject of U.S. patent application Ser. No. 550,523 filed 11-9-83 "COMPLEX QUOTIENT NUCLEAR MAGNETIC RESONANCE IMAGING".

The ratio expression may be solved for velocity relative to a maximum velocity, $V_m$, which satisfies the following equality:

$$G_fT\gamma V_m t_f = \pi$$

so that $$\gamma G_fTt_f = \pi/V_m$$

Then the ratio expression becomes $$\text{Ratio} = \exp(i\pi V/V_m)$$

which can be solved for velocity relative to maximum velocity, $V/V_m$, and displayed in an image of intensity values which are purely a function of velocity. More desirably, a color display of velocity could be displayed overlaying a standard black-and-white image of spatially located material.

In the second technique, a plurality of sequences is taken. Each sequence employs the same gradients, including a motion-encoding gradient. From sequence to sequence the first moment of the motion-encoding gradient pulse sequence is varied, preferably in equal increments for ease of processing. The motion-encoding gradient pulses each have a zero value zero moment, so that stationary particles will experience no net phase encoding from the motion-encoding gradients. Following acquisition of the sequences, Fourier transformation is performed with respect to the spatial encoding gradients, and a further Fourier transformation is performed on the sequence data with respect to the variation in the motion-encoding graidents. This yields a set of images, each representing the amount of material in the image slice which exhibits a given velocity which differs from image to image. By plotting the intensity of a given spatial pixel with respect to image number, a velocity histogram at that point in the slice may be produced.

This process may be illustrated mathematically by considering the following expression for the transverse component of magnetization:

$$\frac{d(M_x + iM_y)}{dt} = -i\gamma H_z(M_x + iM_y)$$

If, for example, the Z-direction is chosen as the direction for the measurement of particle motion, the magnetic field, including the effect of a pulsed Z-gradient coil is:

$$H_z(t,z) = H_o + Gf(t)z$$

where G is the maximum gradient-pulse amplitude and f(t) is a function describing the pulse shape. A particle which at time zero is at position $z_o$ experiences a field due to its velocity in the z-direction, $V_z$, $$H_z = H_o + Gf(t)(z_o + V_z t)$$

Thus, $$\ln(M_x + iM_y)\Big|_0^T =$$

$$-i\gamma H_0 T + \gamma iG \left\{ z_0 \int_0^T f(t)dt + V_z \int_0^T tf(t)dt \right\}$$

Two expressions are in the bracket, one a function of position, and the other a function of velocity. To emphasize the effects of motion, a pulse shape is chosen for which the second expression has a non-zero value for the integral, and the first expression has a zero integral. In the first technique the taking of the ratio cancels the first expression.

It is desirable to gate the time of NMR waveform application relative to a fixed time in the heart cycle, so that each sequence in the second technique acquires data under the same velocity conditions. The venous flow of blood is generally steady enough so that gating is not necessary, but the pulsatile nature of arterial blood flow requires gating so that there is a build-up of correlated data for Fourier transformation.

Figure 4:
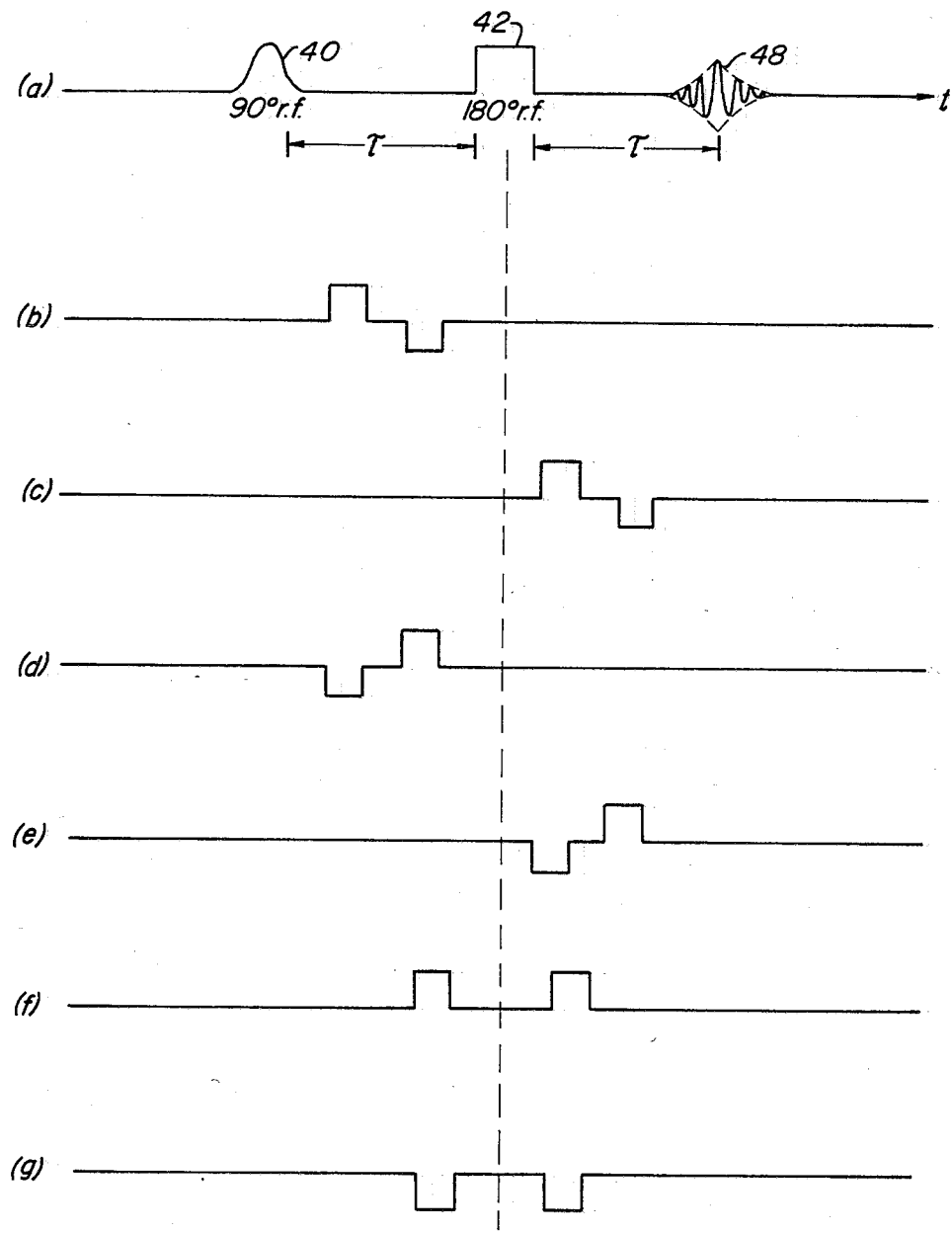
FIG. 4 illustrates the various polarities of gradient pulses which may be employed in the practice of the present invention.

FIG. 4 illustrates the varieties of polarities of double phase-encoding gradient pulses that may be used to encode motion. Each pulse sequence obeys the basic rule of phase-encoding in a first sense, and then in a second sense, during the time interval between the 90 degree pulse 40 and the spin-echo signal 48, and each pulse sequence exhibits a zero value zero moment. The opposite polarity pulse pairs of FIGS. 4b-4e obviously follow this rule, but when the two pulses are separated by the time of the 180 degree pulse 42, a further consideration comes into play. The effect of the 180 degree pulse 42 is to reverse the phases of the spins which rephase to form the spin-echo signal 48. Thus, the pulse pairs of FIGS. 4f and 4g are shown to be of the same polarity. In these cases, the polarity inversion needed for opposite sense phase-encoding and zero value zero moment is provided by the intervening 180 degree pulse 42 and its phase-reversal effect on the spin systems.

All of the above examples have focused on the selection of only the Z direction of flow. It follows, of course, that three data sequences can be taken, choosing a different flow gradient direction, X, Y or Z. In the case of the preferred technique, three sequences of flow-encoded data are taken, each with a different flow gradient direction. Since the flow information obtained is vectorial, with a direction and a magnitude for each direction, the three vectors can be resolved to provide flow vectors in any direction in three-dimensional space.

What is claimed is:

1. A method of acquiring an NMR signal providing motional information of a sample comprising the steps of:
    (a) applying an r.f. excitation signal to said sample for the subsequent production of an NMR signal;
    (b) applying spatial encoding gradient fields to said sample in a pulse sequence in which the gradient pulse train of a gradient in the direction in which motion is to be encoded exhibits a zero value first moment with respect to the timing of an r.f. excitation signal;
    (c) applying a motion encoding gradient field to said sample to encode motion in a given direction which is produced in response to a two-pulse gradient pulse sequence which exhibits a zero value zero moment and a non-zero value first moment; and
    (d) after the above steps, acquiring NMR signal information.

2. The method of claim 1, wherein step (b) further comprises the step of:
    (b) applying three-dimensional spatial encoding gradients $G_x$, $G_y$ and $G_z$ to said sample.

3. The method of claim 1, where step (a) comprises the step of:
    (a) applying a two-pulse r.f. excitation signal to said sample for the subsequent production of an NMR spin-echo signal.

4. The method of claim 3, wherein said two r.f. excitation pulses are a 90 degree pulse and a 180 degree pulse.

5. A method of measuring motion in a sample in an NMR imaging system comprising the steps of:
    (a) acquiring a first sequence of NMR data from said sample by applying r.f. pulses and spatial encoding gradient fields to said sample in the absence of an effective motion-encoding gradient, and reading the resulting NMR signals;
    (b) performing a Fourier transform on said first sequence of NMR data with respect to said spatial encoding gradient characteristics;
    (c) acquiring a second sequence of NMR data from said sample by applying r.f. pulses, spatial encoding gradient fields, and a motion-encoding gradient to said sample, and reading the resulting NMR signals;
    (d) performing a Fourier transform on said second sequence of NMR data with respect to said spatial encoding gradient characteristics;
    (e) forming a ratio image on a pixel-by-pixel basis by dividing pixels of said Fourier-transformed second sequence by respective pixels of said Fourier-transformed first sequence;
    wherein said ratio image is representative of motion in said sample.

6. The method of claim 5, wherein the motion-encoding gradient applied in step (a) is applied by means of a pulse train which exhibits a zero value first moment.

7. The method of claim 5, wherein the motion-encoding gradient applied in step (c) encodes motion in a given direction; wherein the spatial encoding gradient fields applied in step (a) are the same as the spatial encoding gradient fields applied in step (c); and wherein the spatial encoding gradient field of steps (a) and (c)

which is in said given direction is produced by a gradient pulse train which exhibits a zero value first moment.

8. The method of claim 5, wherein said first and second sequences of NMR data are acquired in an interleaved fashion by alternately acquiring data subsequences from said sample and reading the resulting NMR signals as they are developed.

9. A method of measuring motion in a sample in an NMR imaging system comprising the steps of:
  (a) applying a sequence of excitation pulses, spatial-encoding gradients, and a first motion-encoding gradient to said sample, said first motion-encoding gradient being applied by means of a gradient pulse train which exhibits a first, non-zero value first moment; and acquiring NMR signals resulting from the application of said sequence of pulses and gradients;
  (b) applying at least one further sequence of excitation pulses, spatial-encoding gradients, and a second motion-encoding gradient to said sample, said second motion-encoding gradient being applied by means of a gradient pulse train which exhibits a second, non-zero value first moment, and acquiring NMR signals resulting from the application of said sequence of pulses and gradients;
  (c) performing a Fourier transform on said NMR signal information acquired in each of steps (a) and (b), respectively, with respect to said spatial encoding gradient characteristics; and
  (d) performing a Fourier transform on said acquired information with respect to the variation in the first moment of said motion-encoding gradient pulse train,
  whereby a plurality of images, each representing an amount of material in said sample with a different velocity value, are formed.

10. The method of claim 9, wherein step (b) is followed by a further step comprising:
  (b1) applying a plurality of further sequences of excitation pulses, spatial encoding gradients, and motion-encoding gradients to said sample, wherein the motion-encoding gradient in each sequence is applied by means of a gradient pulse train which exhibits a different, non-zero value first moment, and acquiring NMR signals resulting from the application of said sequences of pulses and gradients; and step (c) comprises the step of:
  (c) performing a Fourier transform on said NMR signal information acquired in each of steps (a), (b) and (b1) respectively, with respect to said spatial encoding gradient characteristics.

11. The method of claim 9, wherein step (d) is followed by the further step of:
  (f) plotting the intensity of a plurality of spatially located pixels with respect to image number in said plurality of images to form a velocity histogram.

12. The method of claim 9, wherein the respective spatial-encoding gradient applied in the sequences of steps (a), (b), and (b1) are the same in each sequence.

13. The method of claim 12, wherein step (a) is preceded by the step of:
  (e) applying a sequence of excitation pulses, and spatial-encoding gradients to said sample, with the spatial-encoding gradient in the direction of encoded motion of subsequent steps being applied by means of a gradient pulse train which exhibits a zero value first moment, acquiring NMR signals resulting from the application of said sequence of pulses and gradients, and performing a Fourier transform on said acquired signal information with respect to said spatial encoding gradient characteristics.

14. A method of acquiring an NMR signal providing motional information of a sample comprising the steps of:
  (a) applying an r.f. excitation signal to said sample for the subsequent production of an NMR signal;
  (b) applying spatial encoding gradient fields to said sample, one of said gradient fields being in the direction of a motion-encoding gradient and developed in response to a gradient pulse sequence exhibiting a zero value first moment;
  (c) applying motion-encoding gradients to said sample which are developed in response to a gradient pulse sequence exhibiting a zero value zero moment and a non-zero first moment; and
  (d) acquiring NMR signal information.

15. The method of claim 14, wherein said motion-encoding gradient pulse sequence is a two-pulse sequence.

16. The method of claim 15, wherein said one spatial encoding gradient pulse sequence exhibits a zero value zero moment.

* * * * *